(12) United States Patent
Voldman

(10) Patent No.: US 6,731,488 B2
(45) Date of Patent: May 4, 2004

(54) DUAL EMITTER TRANSISTOR WITH ESD PROTECTION

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 10/063,225

(22) Filed: Apr. 1, 2002

(65) Prior Publication Data

US 2003/0184943 A1 Oct. 2, 2003

(51) Int. Cl.[7] .................................................. H02H 3/22
(52) U.S. Cl. ........................................ 361/111; 361/91
(58) Field of Search .............................. 361/91, 111, 54, 361/56, 78; 257/105, 110, 133, 156, 579; 307/100, 125; 363/50, 53, 56

(56) References Cited

U.S. PATENT DOCUMENTS

| | | | |
|---|---|---|---|
| 3,609,413 A | * 9/1971 | Lane et al. .................. 327/480 |
| 4,049,975 A | * 9/1977 | Colaco ........................ 326/128 |
| 4,092,552 A | * 5/1978 | Hoehn ......................... 327/577 |
| 4,517,475 A | 5/1985 | Petty | |
| 4,570,090 A | 2/1986 | Buscaglia et al. | |
| 4,704,654 A | * 11/1987 | Aberle et al. ................. 361/90 |
| 4,752,913 A | 6/1988 | Chan et al. | |
| 4,812,961 A | * 3/1989 | Essaff et al. .................. 363/61 |
| 4,823,315 A | * 4/1989 | Wood et al. ................. 365/155 |
| 4,839,538 A | * 6/1989 | Curtis ......................... 326/26 |
| 5,051,612 A | * 9/1991 | Agiman ....................... 327/535 |
| 5,140,280 A | 8/1992 | Vyne et al. | |
| 5,148,250 A | * 9/1992 | Winnerl et al. ............. 257/361 |
| 5,164,682 A | * 11/1992 | Taralp ........................ 330/292 |
| 5,539,350 A | 7/1996 | Wilhelm | |
| 5,745,323 A | * 4/1998 | English et al. ................ 361/56 |
| 5,862,031 A | 1/1999 | Wicker et al. | |
| 6,358,781 B1 | * 3/2002 | Lee et al. .................... 438/133 |
| 2003/0026052 A1 | * 2/2003 | Spehar et al. ................. 361/56 |

FOREIGN PATENT DOCUMENTS

| | | | |
|---|---|---|---|
| DE | 02548419 A | * | 10/1975 |
| DE | 2708339 B | * | 5/1978 |
| EP | 000340715 A1 | * | 11/1989 |
| JP | 0037970 | * | 3/1980 |
| WO | WO 9411946 A1 | * | 11/1992 |

* cited by examiner

*Primary Examiner*—Jonathan Salata
(74) *Attorney, Agent, or Firm*—John W. LaBatt; Hoffman, Warnick & D'Alessandro LLC

(57) ABSTRACT

The invention provides a method and circuit design for providing ESD protection. Specifically, a dual emitter transistor is used to provide bipolar operation and ESD protection. The first emitter provides bipolar operation under normal operating conditions. The second emitter provides an alternative current path for ESD protection.

20 Claims, 6 Drawing Sheets

DUAL EMITTER TRANSISTOR WITH ESD PROTECTION

BACKGROUND OF THE INVENTION

1. Technical Field

The invention relates to a method and circuit design for providing electrostatic discharge (ESD) protection for a circuit including a transistor. Specifically, the invention uses a second emitter of a dual emitter transistor to provide an alternative current path to safely dissipate an ESD event.

2. Background Art

In electronic circuitry, ESD events can cause elements of circuitry to fail due to current overloading or reverse bias. For example, the propagation of an ESD event through a circuit may cause an emitter-base junction on a bipolar transistor to become heavily reverse biased and subsequently fail. The voltage required for failure is linearly proportional to the area of the emitter. Consequently, the potential for failure increases as circuitry, and therefore the area of the emitter, becomes smaller.

A common circuit design facing this problem is a differential circuit. In this circuit, two transistors have bases coupled to different voltage pads and their emitters coupled together. The collectors of each transistor as well as the emitters can then be coupled to additional circuitry. In normal operation for radio frequency (RF) applications, the voltage difference between the voltage pads remains within a fraction of a volt. Consequently, any reverse bias on either of the transistors is insufficient to cause failure of the emitter-base junction.

However, an ESD event on one voltage pad may cause a large voltage difference between the two voltage pads. ESD failure can occur due to the reverse or forward biasing of a transistor in the differential pair relative to a power supply or to another pad as the grounded reference voltage. Additionally, failure can occur across the differential pair. For example, the transistor coupled to the voltage pad on which the ESD event occurs may survive the event, however, the opposite transistor can become reverse biased at the emitter-base junction and may fail. A similar situation arises when the differential circuit requires pad-to-pad ESD testing. In this instance, a positive or negative voltage is applied to one voltage pad while the other voltage pad is grounded. The failure level for this circuitry can range from 100 to 400 Volts for RF circuits, to 4,000 to 10,000 Volts when Complementary Metal Oxide Semiconductor (CMOS) technology is used.

One potential solution is to provide ESD protection external to the differential circuit. However, this may adversely effect the loading capacitance, speed, linearity and operating point of the circuitry, coupling with the power supply, frequency response, circuit stability, slew rate, etc. which is unacceptable for many applications. Another possible solution is to make the emitter larger so that larger voltages can be withstood. This solution adversely effects the performance and is frequently unacceptable for many applications. ESD protection circuitry can also be placed on the functional circuit path. However, here again the extra loading and capacitance is unacceptable for some applications.

Consequently, there exists a need for a method and circuit design that provide an alternate current path to dissipate an ESD event without adversely impacting the performance of the functional circuit path during normal operation.

BRIEF SUMMARY OF THE INVENTION

Summary of the Invention

The current invention provides a method and circuit design that provides protection from ESD events without adversely impacting the performance of the functional circuit path during normal operation.

A first aspect of the invention provides a transistor comprising: a first emitter for providing bipolar operation; and a second emitter for providing ESD protection.

A second aspect of the invention provides a method of providing ESD protection comprising: providing a transistor having a first emitter and a second emitter; and coupling the second emitter to an ESD protection circuit.

A third aspect of the invention provides a differential circuit comprising: a first transistor having a base coupled to a first voltage pad, a first emitter and a second emitter; and a second transistor having a base coupled to a second voltage pad, a first emitter coupled to the first emitter of the first transistor, and a second emitter; wherein the second emitter of the first transistor and the second emitter of the second transistor provide ESD protection.

The exemplary aspects of the present invention are designed to solve the problems herein described and other problems not discussed, which are discoverable by a skilled artisan.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Generally stated, the current invention provides a method and circuit design for adding ESD protection to a circuit having a transistor. The invention uses the second emitter on a dual emitter transistor to provide an alternate current path to dissipate an ESD event. An exemplary circuit requiring such protection is a differential circuit, used throughout the drawings. However, it is understood that the invention applies equally to various other circuit designs. Additionally, the exemplary differential circuit can further include various circuitry and is not intended to depict a complete, fully functional differential circuit.

Figure 1:
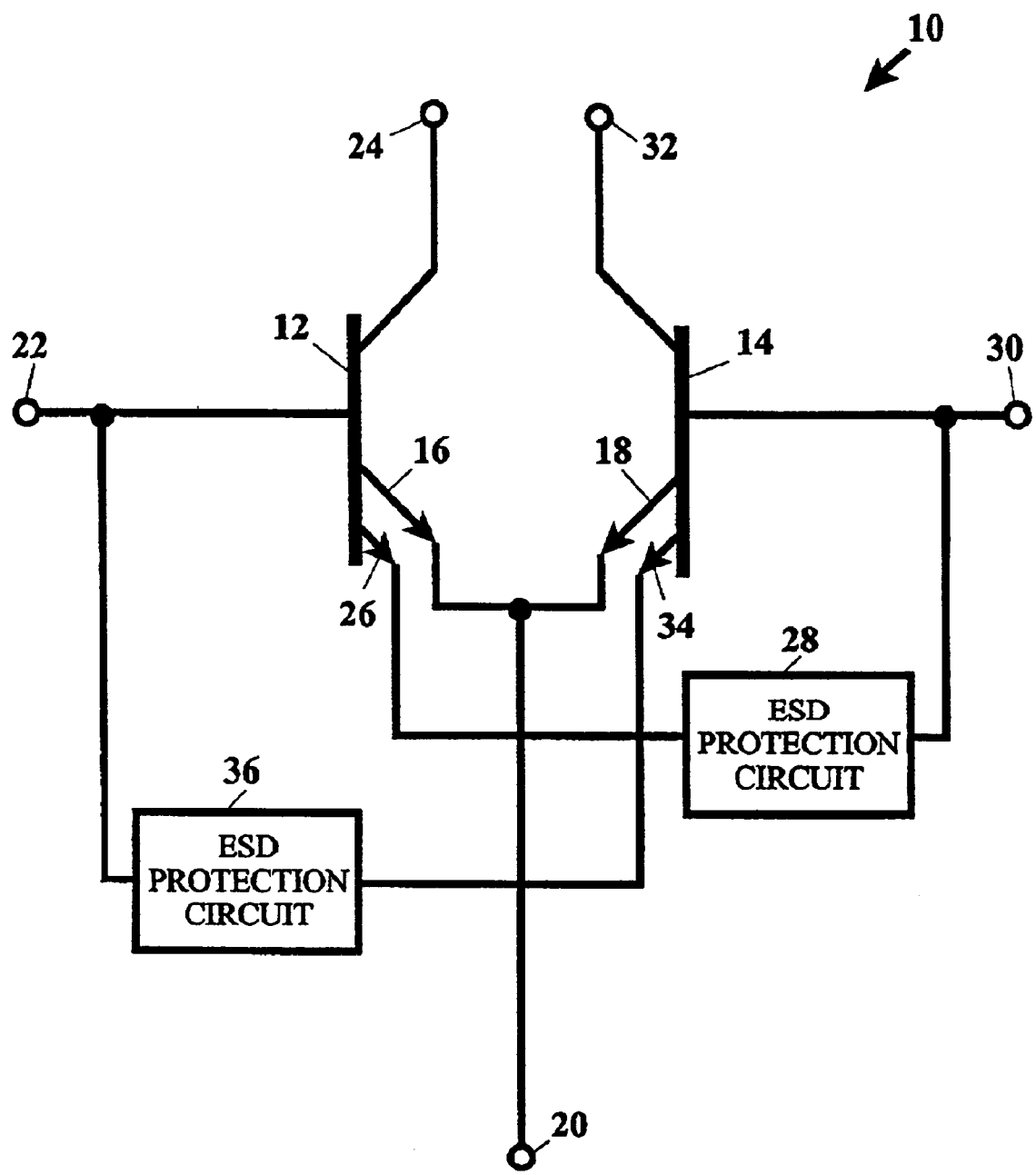
FIG. 1 shows a general design of a differential circuit having ESD protection according to one aspect of the invention.

Turning to FIG. 1, a general design of a differential circuit 10 having ESD protection according to one aspect of the invention is shown. Differential circuit 10 includes two dual emitter transistors 12, 14. Emitters 16, 18 provide bipolar operation and are coupled together and to sink node 20. The bases of transistors 12, 14 are coupled to voltage pads 22, 30 respectively, and the respective collectors are shown coupled to voltage pads 24, 32.

Each transistor 12, 14 includes a second emitter 26, 34 for providing ESD protection. Emitters 26, 34 are coupled to ESD protection circuits 28, 36 respectively, which are then coupled to voltage pads 30, 22 on the opposite side of differential circuit 10. Under normal operation, current may be prevented from flowing through ESD protection circuits 28, 36. However, ESD protection circuits 28, 36 provide an alternate current path to dissipate an ESD event. The current path may be limited to a forward bias mode of operation or current may be allowed to flow in both directions. The alternate current path can dissipate current to the voltage pad on the opposite side of the circuit (as shown), to a base of a transistor, to a ground and/or to a ground plane as described further below.

Figure 2:
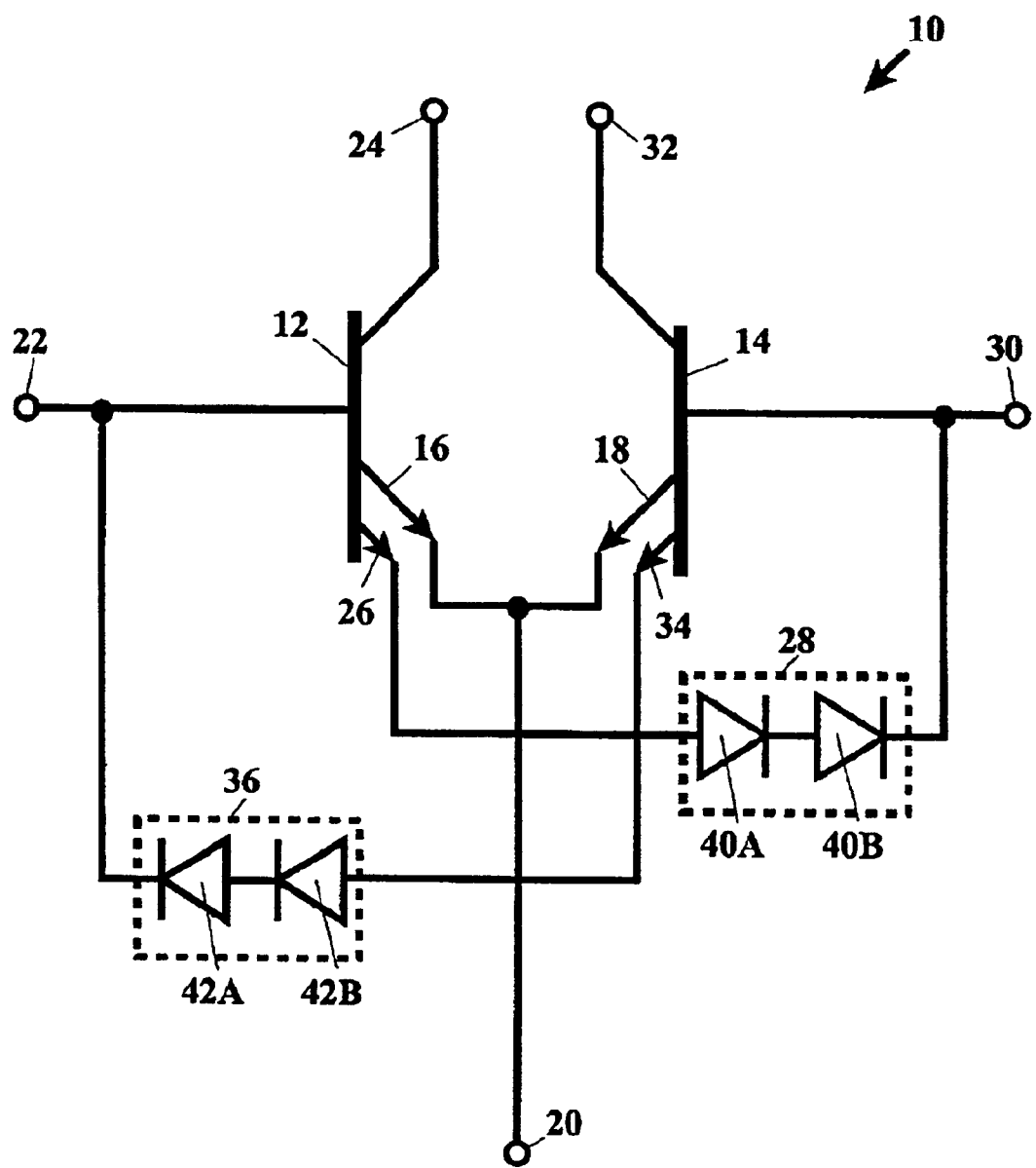
FIG. 2 shows a differential circuit having ESD protection circuitry including a plurality of diodes according to another aspect of the invention.

For example, during ESD testing, a large voltage may be applied to voltage pad 22 while voltage pad 30 may be set to a ground. In this case, current flows through emitter 16 and continues to emitter 18 causing emitter 18 to become reverse biased at the emitter-base junction. If the voltage of the reverse bias is large enough, the emitter-base junction of emitter 18 may break down. To prevent this, emitter 26 provides an alternate current path. ESD protection circuit 28 can be designed to allow current to pass from emitter 26 to voltage pad 30 once the voltage difference between voltage pads 22, 30 is above the normal range of operation for differential circuit 10 but still below the voltage difference at which the emitter-base junction of emitter 18 will break down. In this manner, emitter 26 alleviates the reverse bias at the emitterbase junction of emitter 18. ESD protection circuit 36 and emitter 34 operate in substantially the same manner during an ESD event at voltage pad 30 to alleviate a reverse bias at the emitter-base junction of emitter 16. ESD protection circuits 28, 36 can each comprise an electrical connection that couples, for example, emitters 26, 34 to voltage pads 30, 22 without any intervening circuit elements. However, ESD protection circuits 28, 36 may limit the current flow to a forward bias mode of operation and/or after a certain voltage threshold is met. Turning to FIG. 2, a differential circuit 10 having ESD protection circuits 28, 36 including a plurality of diodes 40A, 40B, 42A, 42B according to another aspect of the invention is shown. ESD protection circuit 28 comprises diodes 40A, 40B and ESD protection circuit 36 comprises diodes 42A, 42B. Diodes 40A, 40B and 42A, 42B are arranged to allow current to flow from emitter 26, 34 to voltage pad 30, 22, respectively. The number of diodes depends on the normal operating voltage range between voltage pads 22, 30 and the breakdown voltage of the emitter-base junction.

For example, two diodes 40A, 40B, each having a voltage drop of about 0.7 volts, can be used in series to prevent current from flowing between emitter 26 and voltage pad 30 when the voltage difference between voltage pads 22, 30 is less than about 1.4 volts. In this case, normal operation for differential circuit 10 can have a voltage difference between voltage pads 22, 30 of less than about 1.4 volts, and emitter 18 has a breakdown voltage due to reverse bias higher than about 1.4 volts. Once a voltage at voltage pad 22 exceeds a voltage at voltage pad 30 by about 1.4 volts, ESD protection circuit 28 becomes forward biased, allowing current to flow from emitter 26 to voltage pad 30. Each diode 40A, 40B, 42A, 42B can be, for example, a schottky diode, a Zener diode, a Silicon—Germanium (SiGe) npn in diode connection, a varactor element, or a field effect transistor in diode configuration.

Figure 3:
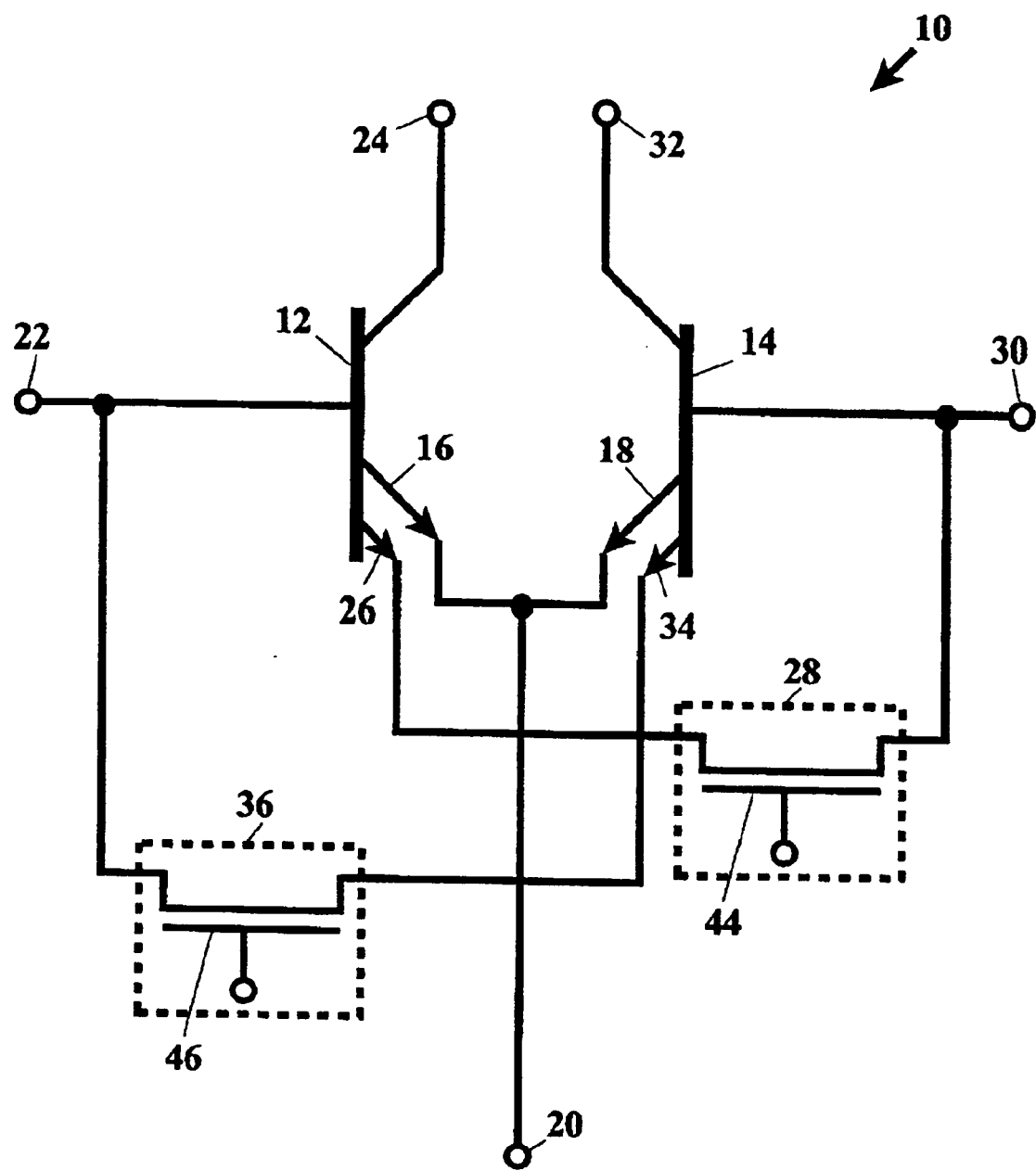
FIG. 3 shows a differential circuit having ESD protection circuitry including field effect transistors according to another aspect of the invention.

Alternatively, FIG. 3 shows differential circuit 10 having ESD protection circuits 28, 36 including field effect transistors 44, 46 according to another aspect of the invention. In this case, ESD protection circuits 28, 36 include field effect transistors (FET) 44, 46, respectively. The gates of FETs 44, 46 can be set to be off during normal operation and can be set to be floating or on during an ESD event thereby allowing current to flow through ESD protection circuit 28 or 36. ESD protection circuits 28, 36 can include a single FET 44, 46, as shown, or a plurality of FETs to add more voltage isolation and less capacitive coupling across differential circuit 10. FETs 44, 46 can be, for example, a metal oxide semiconductor field effect transistor (MOSFET). Alternatively, either FET 44, 46 can be a zero voltage threshold (VT) device that can be biased off during normal operation and "on" during an ESD event. FETs 44, 46 can be triggered by a Resistor-Capacitor (RC) circuit, substrate triggered or have a grounded gate to ensure that FETs 44, 46 turn on in time to prevent breakdown. FETs 44, 46 can be triggered by the same signal or independent signals.

Figure 4:
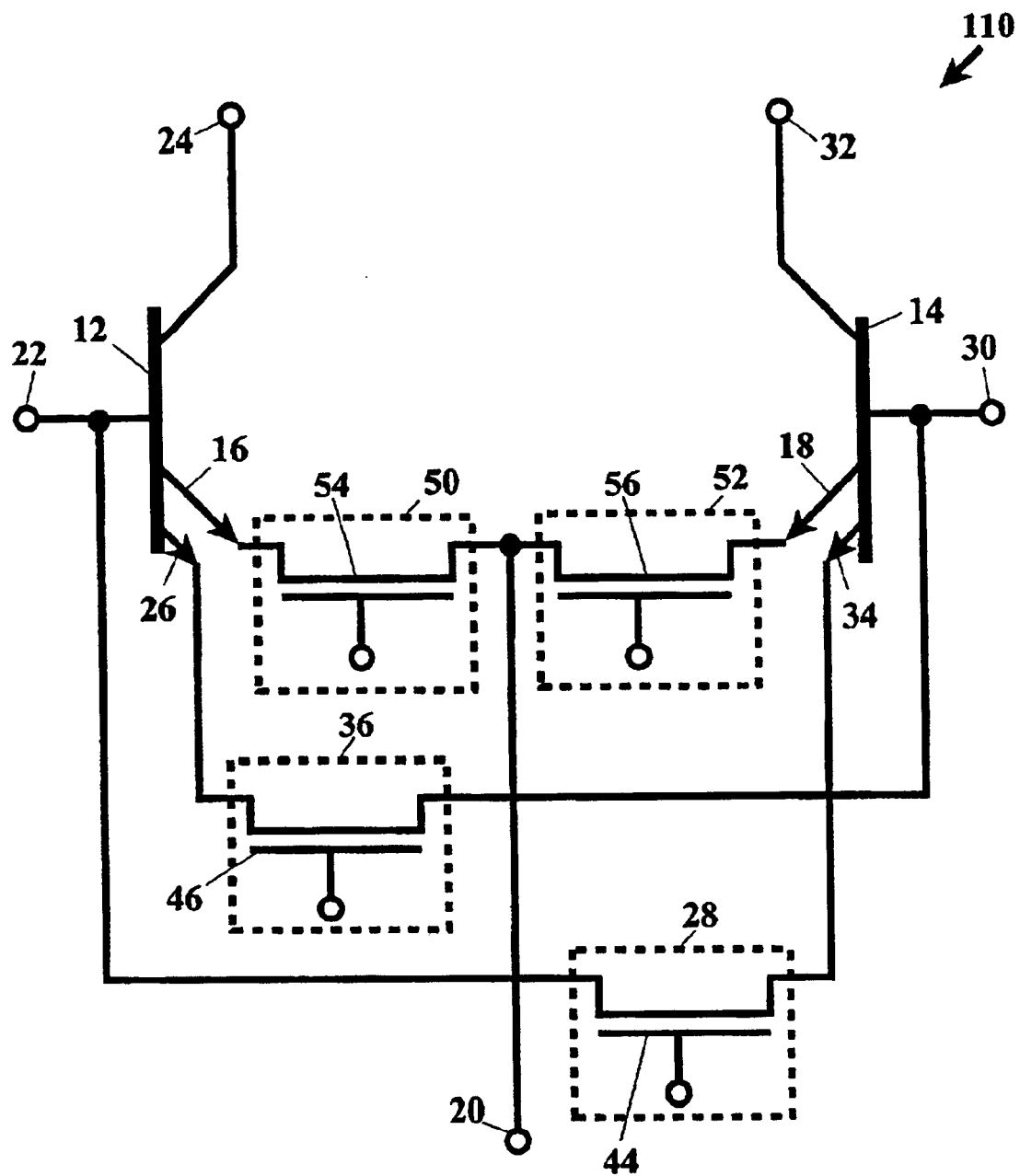
FIG. 4 shows a differential circuit having ESD protection circuitry including disabling circuitry according to another aspect of the invention.

In addition to providing an alternate current path with an ESD protection circuit, the functional circuit path can be disabled during an ESD event. FIG. 4 shows a differential circuit 110 having ESD protection circuits 28, 36 and disabling circuits 50, 52 according to another aspect of the invention. Disabling circuits 50, 52 are placed in series with emitters 16, 18 respectively. Disabling circuits 50, 52 can each comprise one or more FETs, for example, pass transistor MOSFETs. FETs 54, 56 can be placed in low impedance mode when power is applied to the chip and a high impedance mode during ESD events with no power applied.

For example, FETs 54, 56 are placed between emitters 16, 18 respectively, and sink node 20. FETs 54, 56 act as resistor ballast as well as disabling circuits 50, 52. When a pad-to-pad ESD event occurs, the gates of the FETs float to provide a high impedance state. Current then flows through the appropriate ESD protection circuit 28 or 36.

FETs 54, 56 can be disabled by the inverse of the signal that enables FETs 44, 46. For example, FET 44 may be enabled by a signal the inverse of which disables FET 56. A similar arrangement can operate FET 46 and FET 54. Alternatively, the same signal may enable both FETs 44, 46 and the inverse may disable FETs 54, 56. However, all FETs 44, 46, 54, 56 can also be enabled/disabled using separate signals.

Figure 5:
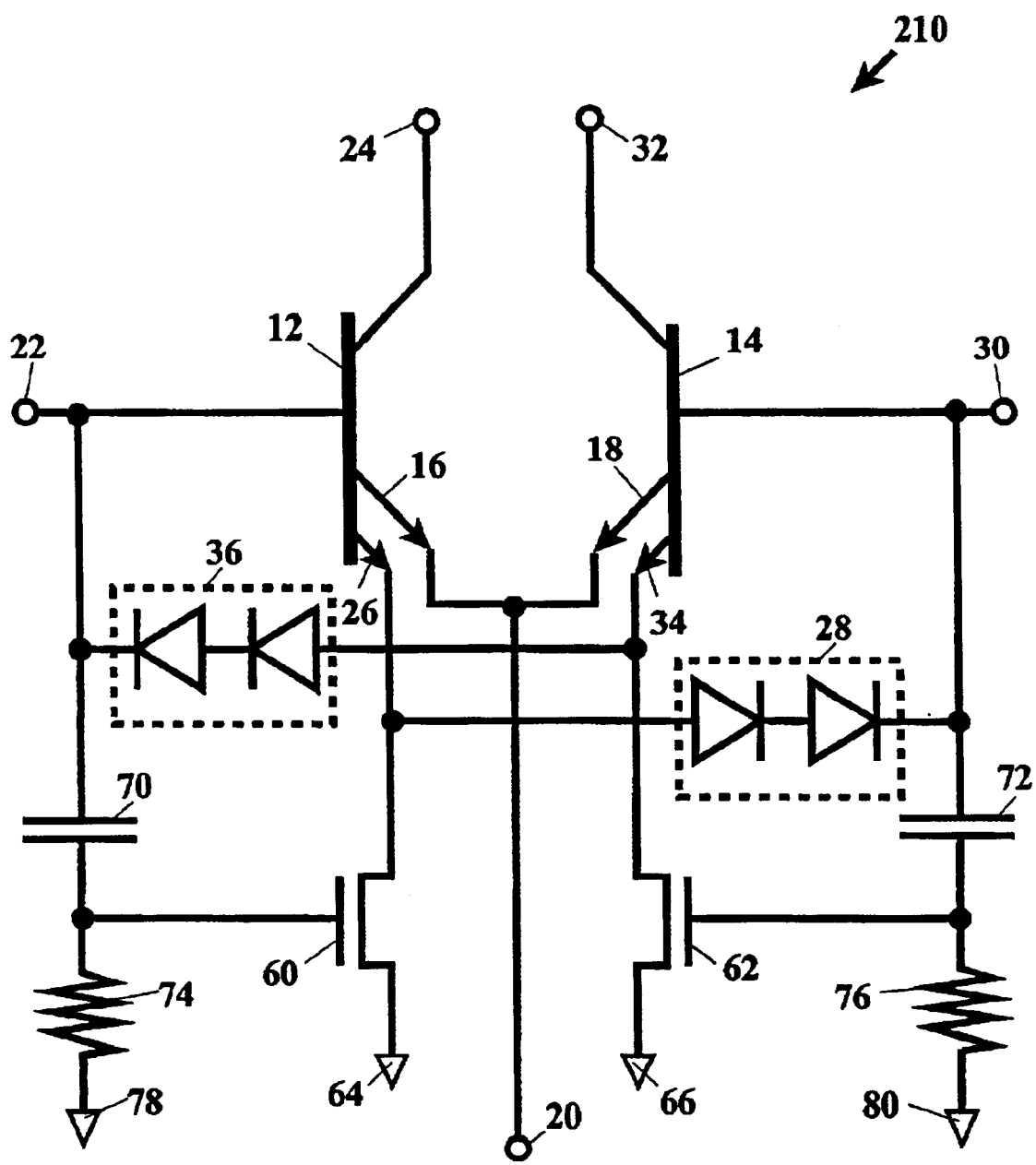
FIG. 5 shows a differential circuit having ESD protection circuitry including a path to a ground according to another aspect of the invention.

A current path to a ground or a ground plane can be provided either alternatively or in addition to a current path to a voltage pad. In FIG. 5, a differential circuit 210 having ESD protection circuitry including a path to a ground according to another aspect of the invention is shown. Differential circuit 210 is shown including ESD protection circuits 28, 36 that operate substantially the same as discussed above. In addition, FETs 60, 62 are coupled to emitters 26, 34 respectively, and provide current paths to grounds 64, 66.

In this example, FETs 60, 62 are triggered by RC circuits that are tied to voltage pads 22, 30 respectively. The RC circuits include capacitors 70, 72 and resistors 74, 76 coupled in series and subsequently coupled to grounds 78, 80. The gates for FETs 60, 62 are coupled between the respective capacitor 70, 72 and resistor 74, 76 pair. The RC circuits can be designed to filter certain pulse widths to prevent FETs 60, 62 from turning on at undesirable times. This allows FETs 60, 62 to be turned on for an ESD event (generally having a narrow pulse width) while ignoring other voltage pulses, for example a chip power up (generally having a wider pulse width).

Figure 6:
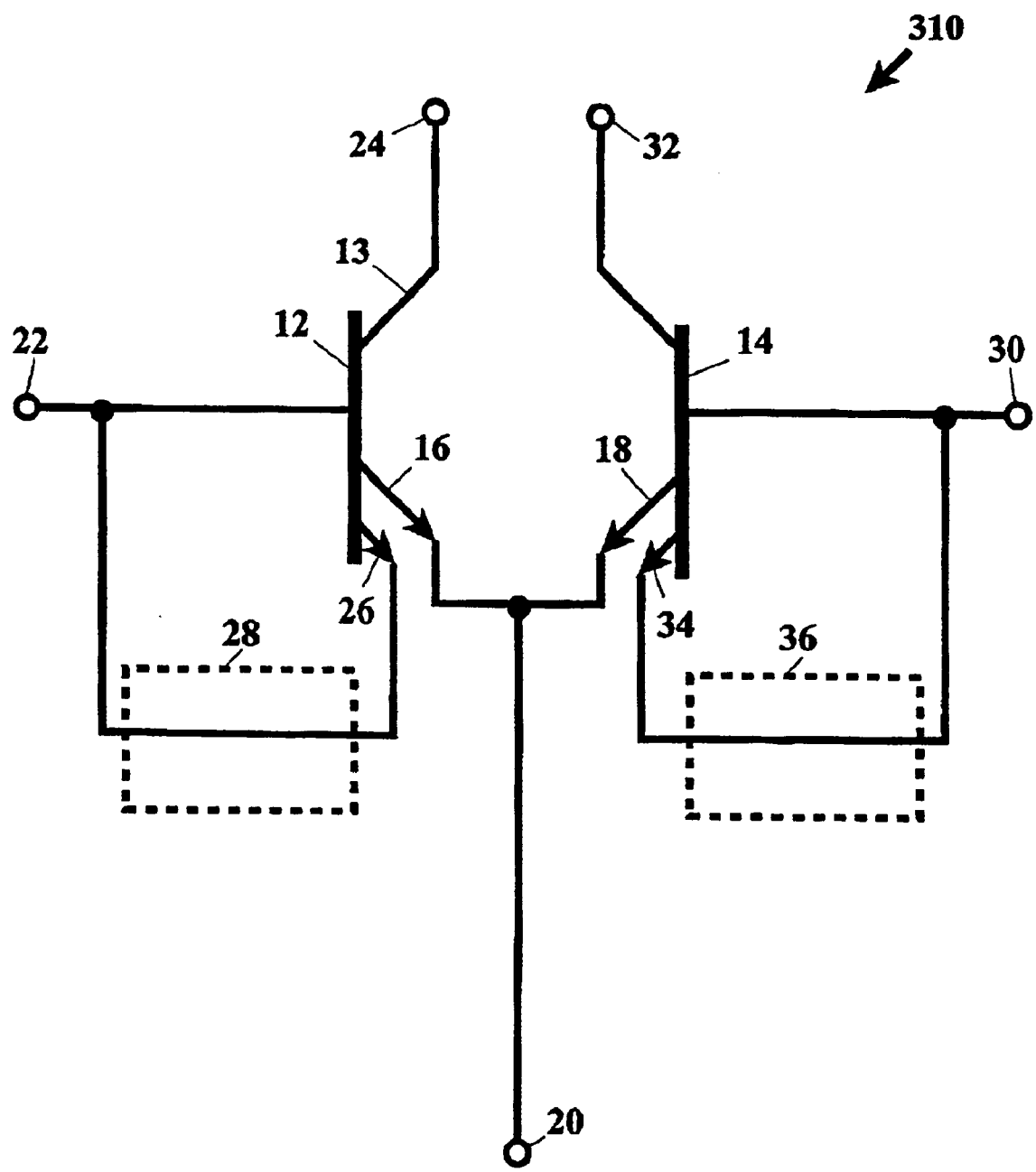
FIG. 6 shows a differential circuit having ESD protection circuitry that is coupled back to the base of each transistor.

The ESD protection circuitry can further provide an alternate current path back to the base of the transistor. FIG. 6 shows differential circuit 310 having ESD protection circuits 28, 36 coupled to emitters 26, 34 and coupled back to the base of transistors 12, 14, respectively. As shown in FIG. 6, ESD protection circuits 28, 36 comprise a short circuit from emitters 26, 34 to voltage pads 22, 30 and the bases of transistors 12, 14, respectively.

Using transistor 12 as an example, this configuration creates a parasitic npn device between collector 13 and emitter 26 of transistor 12. Current flowing in transistor 12 will flow from collector 13 to emitter 26 when emitter 26 is placed spatially closer to the base of transistor 12 and collector 13 at high current. By placing emitter 16 farther from the base of transistor 12 and collector 13, the series resistance of collector 13 makes the current preferentially flow to emitter 26 rather than emitter 16. The configuration of transistor 14 acts in substantially the same way.

The discussion uses the term "ESD event" to refer to any events that produce similar voltage differences across a circuit as those produced by an ESD event. The invention is not limited to protecting circuitry from ESD events, but applies to any events that may produce an abnormally large, and potentially harmful voltage difference across a circuit. ESD events include, for example, ESD testing, electromagnetic interference (EMI), electrical overstress (EOS), and other known ESD events including the human body model (HBM), machine model (MM) and charged device model (CDM) events. Additionally, the discussion uses the term "voltage pad" or "pad" to generically refer to a pad, a pin, etc.

The transistors and the elements of the ESD protection circuits described herein can be made of various technologies now known or later developed including, for example, Silicon (Si), Silicon-Germanium (SiGe), Silicon-Germanium-Carbon (SiGeC), Gallium-Arsenide (GaAs), Gallium-Indium-Phosphide (GaInP), Indium-Phosphide (InP), etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A transistor comprising:
   a first emitter for providing bipolar operation; and
   a second emitter for providing ESD protection.

2. The transistor of claim 1, further including an ESD protection circuit coupled to the second omitter and further coupled to one of the group consisting of: a voltage pad, a ground, a ground plane, and a base of a transistor.

3. The transistor of claim 2, wherein the ESD protection circuit comprises at least one diode.

4. The transistor of claim 3, wherein each diode is selected from the group consisting of: a schottky diode, a Zener diode, a SiGe npn in diode connection, a varactor element, and a field effect transistor in diode configuration.

5. The transistor of claim 2, wherein the ESD protection circuit comprises at least one field effect transistor.

6. The transistor of claim 1, further including a circuit for disabling a current path for the first omitter during an ESD event.

7. The transistor of claim 6, wherein the disabling circuit includes a field effect transistor.

8. A method of providing ESD protection comprising:
   providing a transistor having a first emitter for providing bipolar operation and a second emitter; and
   coupling the second emitter to an ESD protection circuit.

9. The method of claim 8, farther comprising:
   coupling the ESD protection circuit to a voltage pad;
   disabling a current path from the second emitter to the voltage pad during normal operation; and
   enabling the current path during an ESD event.

10. The method of claim 8, further comprising enabling a current path from the second emitter to a ground during an ESD event.

11. The method of claim 8, further comprising disabling a current path from the first emitter during an ESD event.

12. A differential circuit comprising:
    a first transistor having a base coupled to a first voltage pad, a first emitter and a second omitter, and
    a second transistor having a base coupled to a second voltage pad, a first emitter coupled to the first omitter of the first transistor, and a second emitter;
    wherein the second emitter of the first transistor and the second emitter of the second transistor provide ESD protection.

13. The differential circuit of claim 12, wherein the second emitter of the first transistor is coupled to a first ESD protection circuit, and wherein the second emitter of the second transistor is coupled to a second ESD protection circuit.

14. The differential circuit of claim 13, wherein each ESD protection circuit is selected from the group consisting of: at least one diode, at least one varactor element, and at least one field effect transistor in diode configuration.

15. The differential circuit of claim 13, wherein the first ESD protection circuit is further coupled to the second voltage pad, and wherein the second ESD) protection circuit is further coupled to the first voltage pad.

16. The differential circuit of claim 15, wherein each ESD protection circuit provides current flow in a forward bias mode of operation.

17. The differential circuit of claim 15, wherein the second emitter of the first transistor is further coupled to a field effect transistor that is further coupled to a ground.

18. The differential circuit of claim 17, wherein the field effect transistor is RC triggered based on a voltage at the first voltage pad.

19. The differential circuit of claim 12, wherein a current path from the first emitter of the first transistor is disabled during an ESD event, and wherein a current path from the first emitter of the second transistor is disabled during an ESD event.

20. The differential circuit of claim 19, wherein a first field effect transistor disables the current path from the first emitter of the first transistor, and wherein a second field effect transistor disables the current path from the first emitter of the second transistor.

* * * * *